United States Patent
Ang et al.

(10) Patent No.: US 6,770,495 B1
(45) Date of Patent: Aug. 3, 2004

(54) METHOD FOR REVEALING ACTIVE REGIONS IN A SOI STRUCTURE FOR DUT BACKSIDE INSPECTION

(75) Inventors: Boon Y. Ang, Cupertino, CA (US); Mehrdad Mahanpour, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1 day.

(21) Appl. No.: 10/346,507

(22) Filed: Jan. 15, 2003

(51) Int. Cl.[7] ............................ H01L 21/66; G01R 31/26

(52) U.S. Cl. ..................... 438/14; 438/149; 438/459; 438/626; 438/692

(58) Field of Search ........................... 438/14, 16, 459, 438/689, 690, 691, 692, 977, 750

(56) References Cited

U.S. PATENT DOCUMENTS

| | | | | |
|---|---|---|---|---|
| 5,563,084 A | * | 10/1996 | Ramm et al. | 438/15 |
| 5,658,809 A | * | 8/1997 | Nakashima et al. | 438/766 |
| 5,989,974 A | * | 11/1999 | Yamada et al. | 438/407 |
| 6,121,064 A | * | 9/2000 | Lasky et al. | 438/16 |
| 6,191,008 B1 | * | 2/2001 | So | 438/459 |
| 6,300,147 B1 | * | 10/2001 | Naruoka | 438/14 |
| 6,451,668 B1 | * | 9/2002 | Neumeier et al. | 438/401 |
| 6,521,512 B2 | * | 2/2003 | Vasquez | 438/459 |

* cited by examiner

Primary Examiner—Amir Zarabian
Assistant Examiner—Khanh Duong
(74) Attorney, Agent, or Firm—Winstead Sechrest & Minick P.C.

(57) ABSTRACT

Aspects for revealing active regions of a silicon-on-insulator (SOI) circuit for inspection from a backside of a DUT are described. The aspects include etching a substrate layer of an SOI circuit and removing a buried oxide layer beneath the substrate layer. From these steps, active regions beneath the buried oxide layer are revealed.

11 Claims, 1 Drawing Sheet

METHOD FOR REVEALING ACTIVE REGIONS IN A SOI STRUCTURE FOR DUT BACKSIDE INSPECTION

FIELD OF THE INVENTION

The present invention relates to silicon-on-insulator (SOI) structures, and more particularly to revealing active regions in SOI structures for devices under test (DUT) backside inspection.

BACKGROUND OF THE INVENTION

As the manufacturing processes for semiconductor devices and integrated circuits increase in difficulty, methods for manufacturing, testing and debugging these devices become increasingly important. Not only is it important to ensure that individual chips are functional, it is also important to ensure that batches of chips perform consistently. In addition, the ability to detect a defective manufacturing process early is helpful for reducing the possibility of manufacturing a defective device. It is also helpful to be able to perform the manufacture, testing and debugging of integrated circuits in an efficient and timely manner.

One type of circuit structure used in semiconductor devices is silicon-on insulator (SOI) structure. In typical SOI structures, an insulator layer is formed over a semiconductor die substrate, and a thin layer of silicon is formed on the insulator. Source and drain regions are then formed in the silicon layer and over the insulator. One advantage of such structure is that a transistor using the source and drain regions is able to switch faster than a transistor formed using conventional methods, due to reduced capacitance in the resulting structure. However, analysis of devices that employ SOI structure is challenging because accessing source, drain or other circuit regions often requires or at least benefits from destruction of a portion of the structure. The insulator portion of the SOI structure makes access to the active region difficult, particularly when inspection from the sample backside is desired, because the circuitry is formed under the insulator, as shown by the diagram of FIG. 1.

FIG. 1 illustrates a cross-sectional diagram of a typical SOI structure of a DUT with the arrangement of the layers demonstrating a backside approach to the active regions. As shown, the SOI structure includes a silicon substrate layer 10 having a buried oxide (BOX) layer 12 (e.g., silicon dioxide) disposed thereon. An active layer 14, also referred to as a silicon layer, is disposed on the BOX layer 12. As is commonly performed, the active regions of active layer 14 are silicided, i.e., a layer of refractory metal is provided that, when subjected to high enough temperature, reacts with silicon to form what is commonly called a "silicide". Silicides are well known in the art and provide an area in which a dependable silicon contact with low ohmic resistance is formed. The silicided active regions include devices, such as transistors, which include a source 16, drain 18, and gate 20, which are separated by shallow trench isolation (STI) regions 22. Vias 24 (e.g., tungsten) connect the active regions devices to metal layers 26 (e.g., copper). When accessing the active regions of the SOI structure, the destruction of the silicon substrate layer 10 commonly occurs using a TMAH (tetramethylammonium hydroxide) etch. However, inspection of the active regions from the backside is inhibited, since the TMAH etch does not etch oxide and thus the BOX layer 12 remains.

Accordingly, a need exists for an approach to exposing active devices for DUT backside inspection of a SOI structure.

SUMMARY OF THE INVENTION

Aspects for revealing active regions of a silicon-on-insulator (SOI) circuit for inspection from a backside of a DUT are described. The aspects include etching a substrate layer of an SOI circuit and removing a buried oxide layer beneath the substrate layer. From these steps, active regions beneath the buried oxide layer are revealed.

With the present invention, a straightforward approach achieves a more direct view of the active regions as a result of the removal of the BOX layer in SOI structures. These and other advantages will become readily apparent from the following detailed description and accompanying drawings.

DETAILED DESCRIPTION OF THE INVENTION

The present invention relates to revealing active regions in SOI structures for backside inspection. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
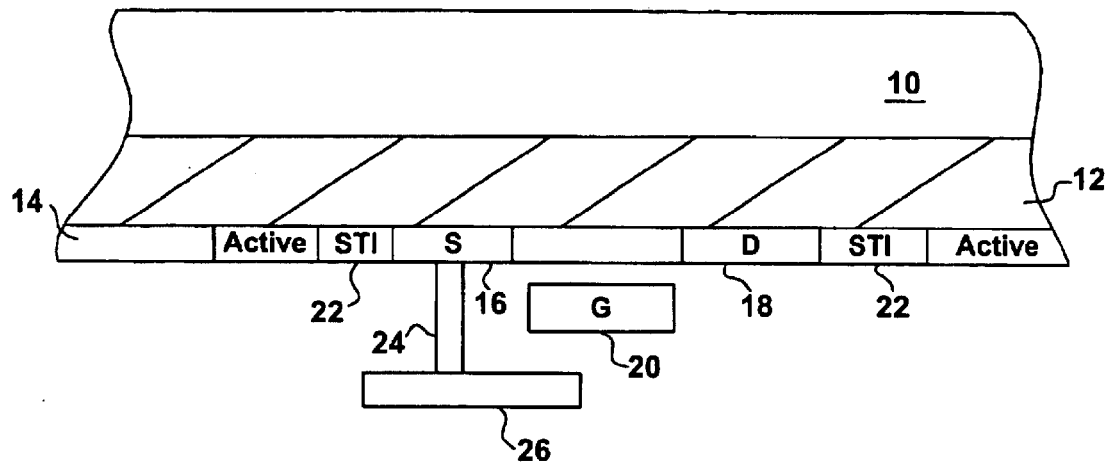
FIG. 1 illustrates a cross-sectional diagram of a typical SOI structure with the arrangement of the layers demonstrating a backside approach to the active regions.
Figure 2:
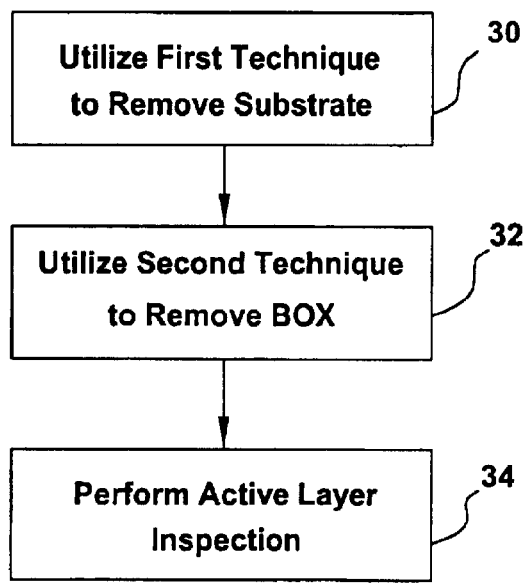
FIG. 2 illustrates an overall block diagram of a process for revealing active regions in SOI structures for DUT backside inspection.

In accordance with the present invention, active regions of an SOI structure are exposed for DUT backside inspection, as described with reference to the flow diagram of FIG. 2 and the SOI structure of FIG. 1. In order to expose the active devices, a first technique is utilized to remove a backside substrate layer, i.e., the substrate layer 10 (step 30). In a preferred embodiment, a standard TMAH etch is utilized as the first technique. Thus, the structure is immersed in a TMAH solution and heated, e.g., to 80 degrees centigrade, for a predetermined time period, e.g., 1 to 2 hours depending upon substrate thickness, as is well understood in the art. Once the substrate layer is removed, the BOX layer 12 is reached, and the process continues by utilizing a second technique to remove the BOX layer (step 32). In a preferred embodiment, CMP (chemical mechanical planarization) is utilized as the second technique to polish off the BOX layer. Preferably, known polishing techniques with CMP for oxide removal are utilized for the removal of the BOX layer 12. Visual inspection of the active layer 14 then occurs (step 34) using standard techniques with a more direct view of the active regions as a result of the removal of the BOX layer in accordance with the present invention.

It should be appreciated that the present invention can be utilized for DUT backside inspection of SOI structures at a die or a wafer level. However, for the wafer level, preferably a support structure, such as a blank wafer, is provided at the frontside to achieve better handling and strength during the layer removal steps, particularly the polishing step. Further, it should be appreciated that once the BOX layer is removed, any residual silicon of the non-silicided portions of layer 14 may be removed using TMAH without detriment to the silicided regions, since they are resistant to the TMAH and thus remain intact for inspection/analysis, as is well understood in the art.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. A method for revealing active regions of a silicon-on-insulator (SOI) circuit for inspection from a backside of a device under test (DUT), the method comprising:

etching a substrate layer of the SOI circuit; and removing a buried oxide layer beneath the substrate layer by performing chemical mechanical planarization (CMP) on the buried oxide layer, wherein active regions beneath the buried oxide layer are revealed.

2. The method of claim 1 wherein the etching step further comprises utilizing TMAH to etch the substrate layer.

3. The method of claim 2 wherein the substrate layer further comprises a silicon layer.

4. The method of claim 1 further comprising performing visual inspection on the revealed active regions.

5. A method for revealing active regions of a silicon-on-insulator (SOI) circuit for inspection from a backside of a device under test (DUT), the method comprising:

performing a first layer removal technique to reveal a buried oxide layer in the SOI circuit; and performing a second layer removal technique to reveal an active layer beneath the buried oxide layer by performing chemical mechanical planarization (CMP) on the buried oxide layer, wherein visual inspection of the active layer revealed is more readily achieved.

6. The method of claim 5 wherein performing a first layer removal technique further comprises TMAH etching of a silicon substrate.

7. The method of claim 5 wherein the performing a first layer removal technique and performing a second layer removal technique occur from a backside of the SOI circuit.

8. The method of claim 5 wherein the active layer further comprises silicided active regions.

9. A method device under test (DUT) for backside inspection of silicon-on-insulator (SOI) circuit, the method comprising:

etching a substrate layer of the SOI circuit; removing a buried oxide layer beneath the substrate layer and above silicided active regions by performing chemical mechanical planarization (CMP) on the buried oxide layer, wherein the silicided regions are revealed; and performing visual inspection on the revealed silicided active region.

10. The method of claim 9 wherein the etching step further comprises utilizing TMAH to etch the substrate layer.

11. The method of claim 10 wherein the substrate layer further comprises a silicon layer.

* * * * *